(12) United States Patent
Jomaa et al.

(10) Patent No.: US 7,909,977 B2
(45) Date of Patent: Mar. 22, 2011

(54) METHOD OF MANUFACTURING A SUBSTRATE FOR A MICROELECTRONIC DEVICE, AND SUBSTRATE FORMED THEREBY

(75) Inventors: Houssam Jomaa, Phoenix, AZ (US); Amruthavalli P. Alur, Chandler, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 326 days.

(21) Appl. No.: 12/056,985

(22) Filed: Mar. 27, 2008

(65) Prior Publication Data

US 2009/0246462 A1 Oct. 1, 2009

(51) Int. Cl.
C25D 5/34 (2006.01)
(52) U.S. Cl. .......................................... 205/205; 205/183
(58) Field of Classification Search .................. 205/126, 205/210, 211, 183, 205
See application file for complete search history.

(56) References Cited

U.S. PATENT DOCUMENTS

| 4,808,274 | A | * | 2/1989 | Nguyen | 361/748 |
| 4,897,338 | A | * | 1/1990 | Spicciati et al. | 430/314 |
| 5,108,553 | A | * | 4/1992 | Foster et al. | 205/125 |
| 6,085,414 | A | * | 7/2000 | Swarbrick et al. | 29/847 |
| 2007/0163887 | A1 | * | 7/2007 | Hofmann | 205/80 |

FOREIGN PATENT DOCUMENTS

| WO | 2009/120967 A2 | 10/2009 |
| WO | 2009/120967 A3 | 4/2010 |

* cited by examiner

*Primary Examiner* — Luan V Van
(74) *Attorney, Agent, or Firm* — Kenneth A. Nelson

(57) ABSTRACT

A method of manufacturing a substrate for a microelectronic device comprises providing a dielectric material (120, 220, 920) as a build-up layer of the substrate, applying a primer (140, 240, 940) to a surface (121, 221, 921) of the dielectric material, and forming an electrically conductive layer (150, 250, 950) over the primer. In another embodiment, the method comprises providing the dielectric material, forming the feature extending into the dielectric material, forming the electrically conductive layer over the dielectric material, applying the primer to a surface of the electrically conductive layer and attaching a dielectric layer (960) to the primer.

11 Claims, 7 Drawing Sheets

METHOD OF MANUFACTURING A SUBSTRATE FOR A MICROELECTRONIC DEVICE, AND SUBSTRATE FORMED THEREBY

FIELD OF THE INVENTION

The disclosed embodiments of the invention relate generally to substrates for microelectronic devices, and relate more particularly to adhesion between layers in such substrates.

BACKGROUND OF THE INVENTION

Microelectronic devices typically are formed on a substrate that, among other things, provides mechanical support as well as space for electrical connections and the like. The substrate also acts as an interposer whereby it spaces the connections from the die scale to the motherboard scale. Substrate types include cored substrates, including thin core, thick core (BT or FR4 type), and laminate core, as well as coreless substrates. According to one process, cored substrates are built up layer by layer around a central core, with layers of conductive material (usually copper) separated by layers of insulating dielectric, with interlayer connections being formed with through holes or microvias. Whatever the substrate type, in order to promote adhesion between the layer interfaces, layer surfaces are typically roughened for proper mechanical interlocking.

BRIEF DESCRIPTION OF THE DRAWINGS

The disclosed embodiments will be better understood from a reading of the following detailed description, taken in conjunction with the accompanying figures in the drawings in which.

Figure 1:
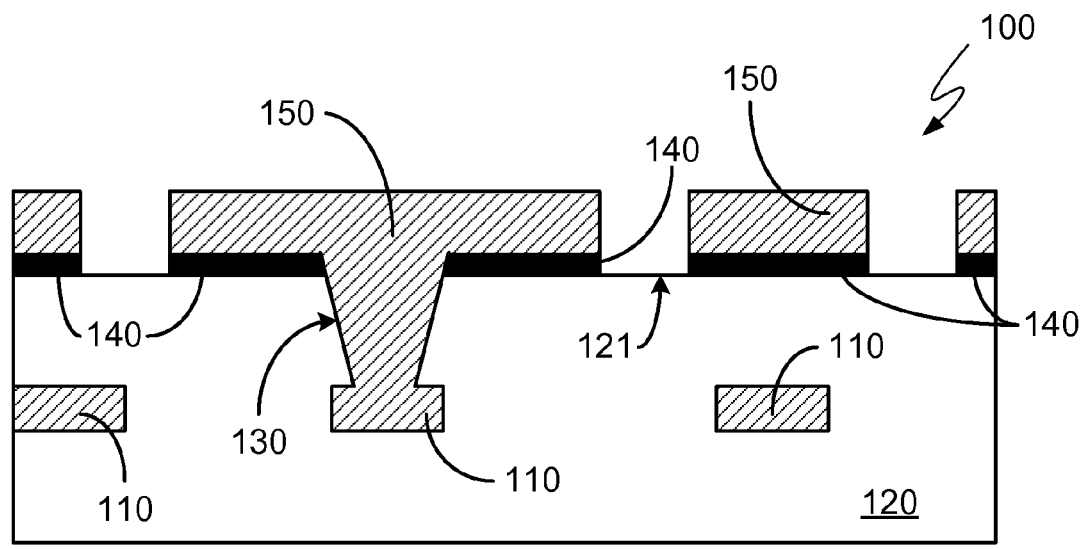
FIGS. 1, 2, and 9 are cross-sectional views of a portion of a substrate for a microelectronic device according to various embodiments of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first,", "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of manufacturing a substrate for a microelectronic device comprises providing a dielectric material as a build-up layer of the substrate, applying a primer to a surface of the dielectric material, and forming an electrically conductive layer over the primer. In another embodiment, the method comprises providing a dielectric material as a build-up layer of the substrate, forming a feature that extends into the dielectric material, forming an electrically conductive layer over the dielectric material, applying a primer to a surface of the electrically conductive layer and attaching a dielectric layer to the primer. Accordingly, embodiments of the invention may be used both for conductor-dielectric interfaces and for dielectric-conductor interfaces.

Adhesion between the interfaces of the dielectric material and the electrically conductive material is often difficult to achieve and if not properly performed can result in delamination between the layers of the substrate, or similar problems. As mentioned above, one existing approach for obtaining the needed adhesion is to roughen the material surfaces in order to promote proper mechanical interlocking. For non-organic materials (including copper or other electrically conductive materials) this roughening may be accomplished by treating the surfaces with a formaldehyde- or acid-peroxide-based roughening agent that causes the copper surface to become micro-roughened, with a roughness profile that at least partially depends on the concentration of the roughening agent and the exposure time to the roughening agent. For organic materials (including the dielectric material) the roughening may be accomplished using a desmear treatment.

However, at least for the semi-additive process (SAP), these roughening treatments limit the capability to provide reliable line and space adhesion at fine pitch with yields acceptable for high volume manufacturing. This is mainly due to the increased dielectric roughness post desmear which requires extended etching times to remove the electroless seed layer, thus requiring a larger starting thickness for the conductive layer and limiting the SAP process capability. Similarly, the roughening on the conductive layers can lead to reduced overall conductor thickness with little control on the surface profile of the conductor material, a limitation that becomes more evident with finer lines. The roughening process also impacts electrical performance, limits the number of suitable dielectric materials, and has a detrimental effect on electrical performance for high speed input output (HSIO) by impacting insertion loss and impedance variation.

Embodiments of the invention avoid these and other problems by enhancing adhesion between substrate interfaces without resorting to any roughening of such interfaces, resulting in a profile-free metal-dielectric adhesion interface. This adhesion enhancement can be obtained for both SAP technology and for laser ablation technology, both of which form embedded conductive trenches in the dielectric material, as well as for other similar technologies that enable formation of embedded features. The primer may be used at multiple interfaces, possibly as dictated by the attendant electrical benefits, to provide a completely profile-free substrate. As will be described below, embodiments of the invention make use of a primer to promote proper adhesion between profile-free metal (or other electrically conductive materials) and dielectric interfaces, maintaining the integrity of such interfaces while enabling enhanced electrical performance. In one embodiment, "profile-free" as used herein means having a roughness of no greater than approximately 0.1-0.2 micrometers (hereinafter "microns").

Referring now to the drawings, FIG. 1 is a cross-sectional view of a portion of a substrate 100 for a microelectronic device according to an embodiment of the invention. As an example, substrate 100 may be formed using an SAP process. As illustrated in FIG. 1, substrate 100 comprises a material 110 that is at least partially surrounded by a dielectric material 120, a feature 130 extending into dielectric material 120, a primer 140 over a surface 121 of dielectric material 120, and an electrically conductive layer 150 adjacent to primer 140. Note that electrically conductive layer 150 is located above surface 121 of dielectric material 120, characteristic of the SAP procedure.

As an example, material 110 can comprise a metal such as copper or the like or can be some other electrically conducting layer of substrate 100, while dielectric material 120 can comprise an epoxy-based dielectric material or the like and electrically conductive layer 150 can be a copper trace or pad or the like. As an example, the dielectric material may be filled with fillers or glass fibers or the like in order to reduce the coefficient of thermal expansion (CTE) of the material. In the illustrated embodiment, feature 130 is a via but feature 130 could also be a trench or some other feature that extends into dielectric material 120. As another example, primer 140 can be based on either polyether sulfone or amide-type epoxy materials, both of which have demonstrated good adhesion between some types of metal and dielectric material and could therefore be used for both SAP and laser ablation processes where adhesion at the interface between the dielectric and the copper (or other electrically conductive) material is needed. The particular chemistry of primer 140 may be optimized for the process being used and may be modified as needed to meet specific process requirements.

Figure 2:
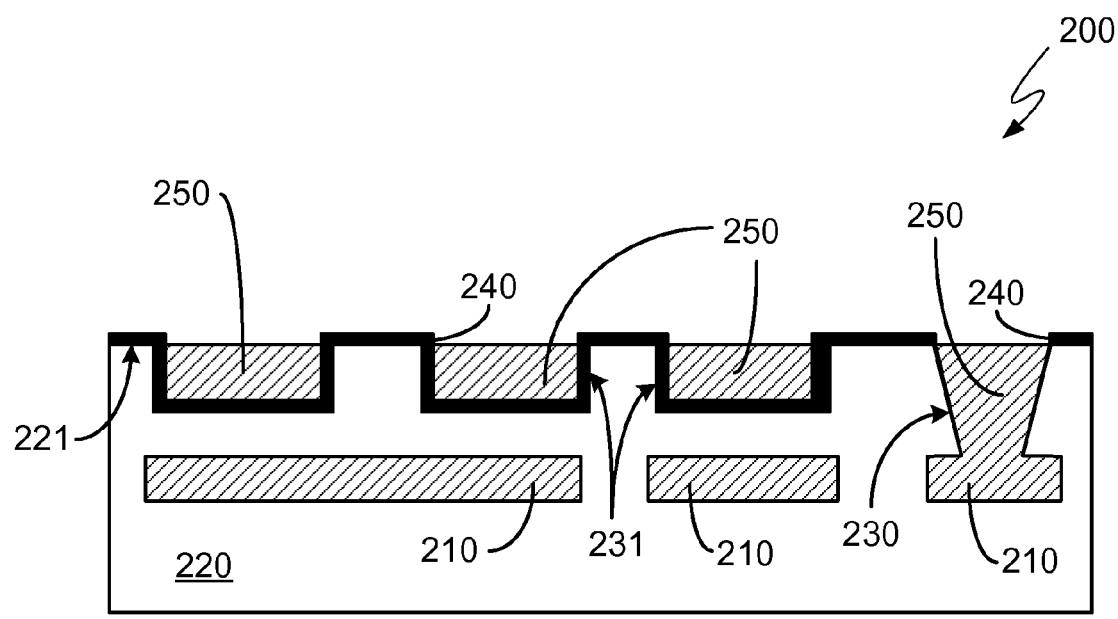

FIG. 2 is a cross-sectional view of a portion of a substrate 200 for a microelectronic device according to an embodiment of the invention. As an example, substrate 200 may be formed using a laser ablation process. As illustrated in FIG. 2, substrate 200 comprises a material 210 that is at least partially surrounded by a dielectric material 220, features 230 and 231 extending into dielectric material 220, a primer 240 over a surface 221 of dielectric material 220, and an electrically conductive layer 250 adjacent to primer 240. Note that electrically conductive layer 250 is embedded within dielectric material 220 (i.e., lies below surface 221), characteristic of the embedded feature formation procedure.

As an example, material 210, dielectric material 220, feature 230, primer 240, and electrically conductive layer 250 can be similar to, respectively, material 110, dielectric material 120, feature 130, primer 140, and electrically conductive layer 150, all of which are shown in FIG. 1. Feature 231, which does not have a named counterpart in FIG. 1, is a trench.

Figure 3:
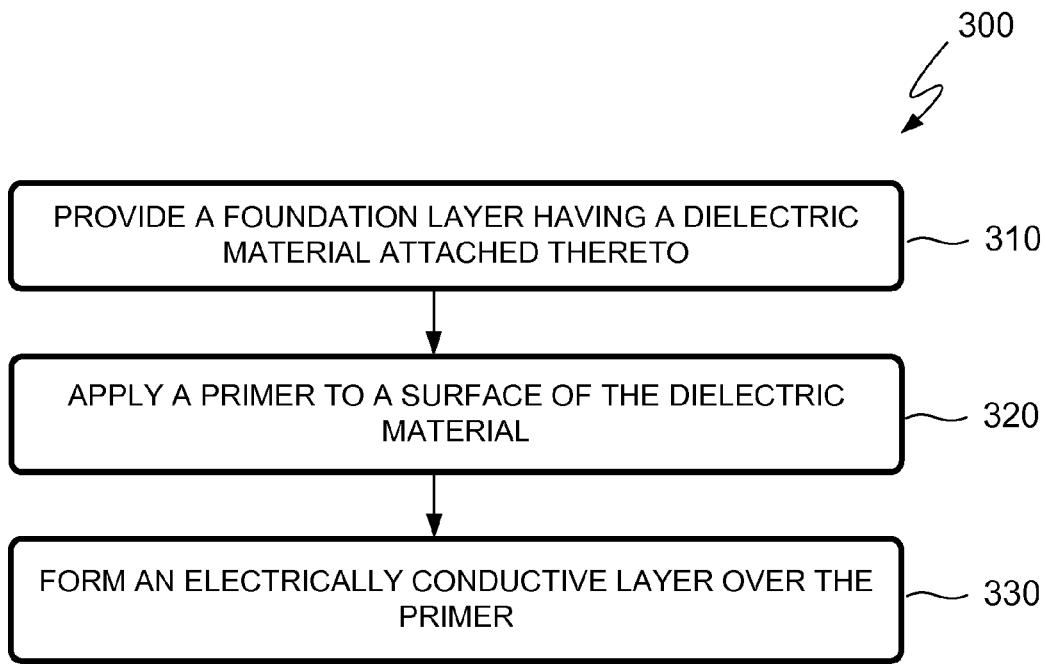
FIGS. 3, 4, 6, and 10 are flowcharts illustrating methods of manufacturing a substrate for a microelectronic device according to various embodiments of the invention.

FIG. 3 is a flowchart illustrating a method 300 of manufacturing a substrate for a microelectronic device according to an embodiment of the invention. In at least one embodiment, method 300 (along with subsequent methods discussed herein) promotes adhesion between a dielectric and an electrically conductive material.

A step 310 of method 300 is to provide a foundation layer having a dielectric material attached thereto. It should be understood that the phrase "foundation layer" as used herein does not necessarily mean a lowest layer, a base layer, a starting layer, a supporting layer, or the like; rather, it is used merely to indicate the layer or material on which another indicated material or layer—in this case a dielectric material—is attached. As an example, the foundation layer can be similar to material 110 that is shown in FIG. 1 or to material 210 that is shown in FIG. 2. As another example, the dielectric material can be similar to dielectric material 120 that is shown in FIG. 1 or to dielectric material 220 that is shown in FIG. 2. In one embodiment, step 310 comprises laminating the dielectric material onto the foundation layer.

A step 320 of method 300 is to apply a primer to a surface of the dielectric material. As an example, the primer can be similar to primer 140 that is shown in FIG. 1 or to primer 240 that is shown in FIG. 2. In one embodiment, step 320 comprises coating the primer on the surface of the dielectric material using one of a thin film lamination process and a roller coating operation, though other coating techniques may also be used. As an example, in the latter approach step 320 may be accomplished using a roller coating apparatus such as that shown in FIG. 11, discussed below.

A step 330 of method 300 is to form an electrically conductive layer over the primer. As an example, the electrically conductive layer can be similar to electrically conductive layer 150 that is shown in FIG. 1 or to electrically conductive layer 250 that is shown in FIG. 2. In certain embodiments, step 330 comprises a trench metallization process that results in the formation of a copper trace.

As an example, in one embodiment the trench is formed by laser ablation of the dielectric surface (or by another imprinting technique) followed by a metallization process that includes electrolessly depositing a first electrically conductive layer followed by an electrolytical plating step to fill the formed trenches with a second electrically conductive layer and a subsequent grinding or buffing step to planarize the surface. It should be understood that the first and second electrically conductive layers may merge into a single layer in which the original first and second layers are indistinguishable from each other and in which any boundary between the two layers disappears.

In another embodiment, metallization may occur by first depositing an electroless seed layer on top of the laminated or coated primer followed by film resist (either dry or liquid) lamination and exposure to define patterns which will then be electrolytically plated with an electrolytic plating process. This is followed by stripping the dry or liquid film resist with a stripper solution and by an etching process in which the electroless seed layer is removed in order to form defined conductive traces on the surface of the dielectric layer.

Still other embodiments involve solely using electroless copper for filing the trenches with high speed electroless copper deposition, selective trench plating without over plating on the surface, and the like. It should be understood that the foregoing examples are merely illustrative of a wide variety of possible metallization techniques that may be used according to various embodiments of the invention, and any electroless, electrolytic chemistry and plating technique, as well as any resist technology may be utilized.

Method 300 could be used as part of both the SAP and the trench formation processes. It will be recognized by one of ordinary skill in the art that certain additional steps and/or other modifications may be made to method 300 in order to more fully adapt the method to one process or the other (or to a different process) or in order to enable or improve other embodiments of the invention. Some such modifications to method 300 will be discussed in more detail below. For clarity of discussion, these methods will be given their own identification numbers even though some of their steps are the same as some of those in method 300.

Figure 4:
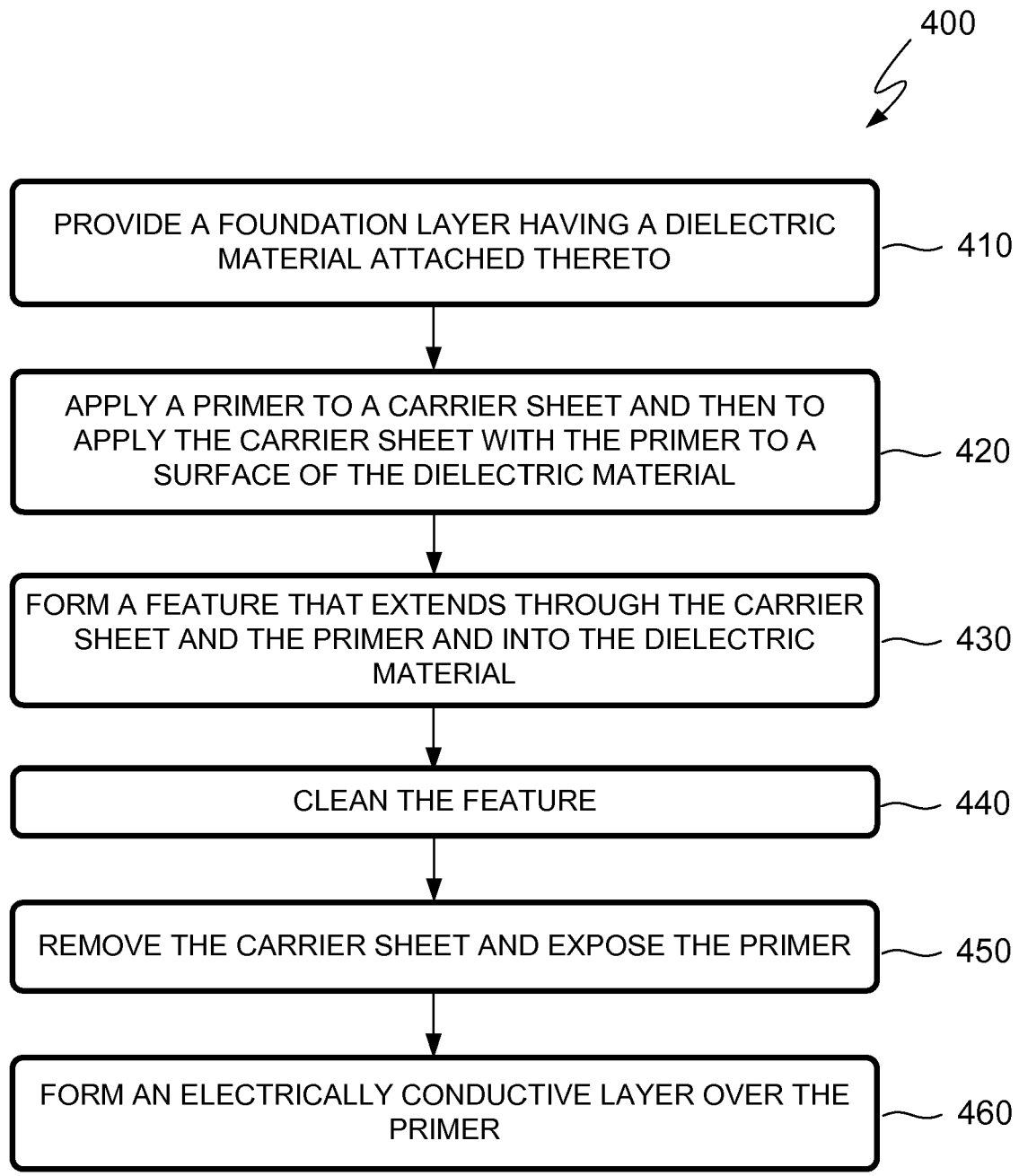

FIG. 4 is a flowchart illustrating a method 400 of manufacturing a substrate for a microelectronic device according to an embodiment of the invention. As an example, method 400 may be used as part of an SAP process, and may result in a structure that is the same as or similar to substrate 100 as depicted in FIG. 1.

A step 410 of method 400 is to provide a foundation layer having a dielectric material attached thereto. As an example, the foundation layer can be similar to material 110 that is shown in FIG. 1 or to material 210 that is shown in FIG. 2. As another example, the dielectric material can be similar to dielectric material 120 that is shown in FIG. 1 or to dielectric material 220 that is shown in FIG. 2. In one embodiment, step 410 comprises laminating the dielectric material onto the foundation layer.

Figure 5:
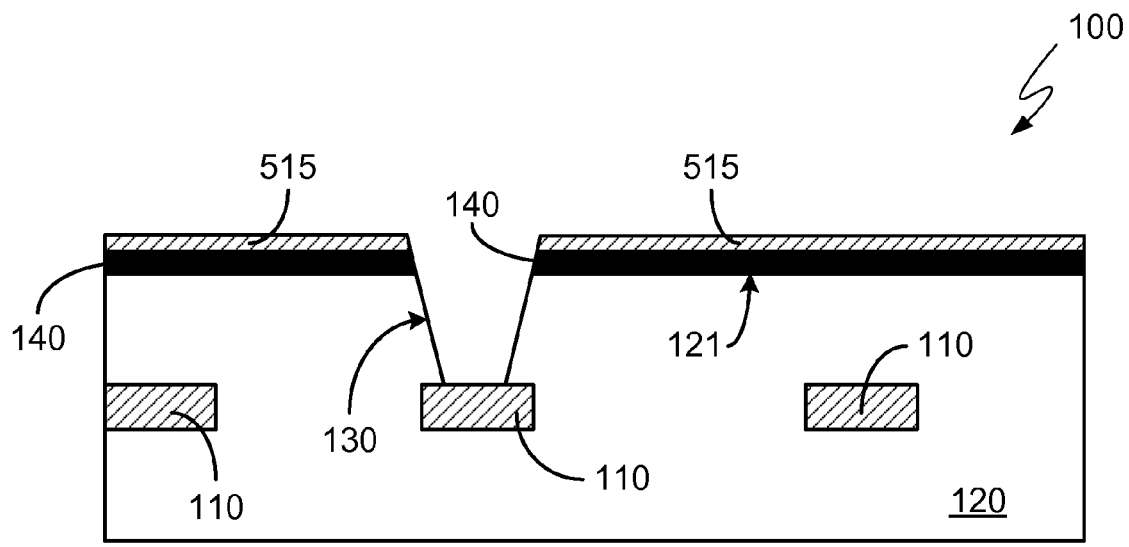
FIG. 5 is a cross-sectional view of the substrate of FIG. 1 at a particular point in its manufacturing process according to an embodiment of the invention.

A step 420 of method 400 is to apply a primer to a carrier sheet and then to apply the carrier sheet with the primer to a surface of the dielectric material. As an example, the primer can be similar to primer 140 that is shown in FIG. 1 or to primer 240 that is shown in FIG. 2. As another example, the carrier sheet can be similar to a carrier sheet 515 that is shown in FIG. 5, which is a cross-sectional view of substrate 100 at a particular point in its manufacturing process according to an embodiment of the invention. In one embodiment, carrier sheet 515 is a copper foil or the like. In a particular embodiment, the copper foil can have a thickness of approximately one micron up to approximately three microns. As an example, copper foil that is pre-treated with the primer can be laminated and pressed at elevated temperature onto the surface of the dielectric material.

A step 430 of method 400 is to form a feature that extends through the carrier sheet and the primer and into the dielectric material. As an example, the feature can be similar to feature 130 that is shown in FIG. 1 or to feature 230 or feature 231 that are shown in FIG. 2. Accordingly, in one embodiment the feature can be a via or a trench or the like. In the same or another embodiment, more than one feature may be formed, and what is said herein regarding the feature may also be applied to additional features of the same kind unless the text or the context indicate otherwise. As an example, an excimer laser, an ultraviolet (UV) laser, or a $CO_2$ laser may be used to perform step 430. In one embodiment, an excimer laser is used to form trenches and a $CO_2$ laser is used to form vias. More generally, any type of laser that is suitable for the process of trench or via formation may be used on laser ablated trench patterns and any type of laser may be used to form vias on an SAP patterned substrate. Other approaches such as through hole drilling or mechanically "punching" through the dielectric may also be applied.

A step 440 of method 400 is to clean the feature. As an example, step 440 can comprise, at least in part, performing a desmear operation on a via. Desmear is a process in which the dielectric material is usually dipped in a series of solutions which may include one or more of a swelling solution to swell the resin material, an etching solution that oxidizes the surface of the resin and removes loose residue from the feature formation process, and a neutralizing solution that removes any residual etching solution from the dielectric. As an example, the swelling solution may comprise an ethylene glycol-based solution or the like, the etching solution may comprise sodium permanganate, potassium permanganate, sodium chromate, potassium chromate, or the like, and the neutralizing solution may comprise a sulfuric acid/hydrogen peroxide-based neutralizer or the like. Note, however, that both the sequence, solutions, and their compositions may not necessarily be as stated above, and any desmear chemistry that is suitable for the dielectric of choice may be used, according to various embodiments of the invention.

Note that the dielectric material away from the feature is not impacted by the desmear (or other cleaning operation) because it is covered by the copper foil (or other carrier sheet). Accordingly, in this process the desmear parameters can be taken advantage of to ensure via reliability without impacting the roughness of the dielectric surface where the traces will be situated.

A step 450 of method 400 is to remove the carrier sheet and expose the primer. In an embodiment where the carrier sheet is a copper foil, step 450 comprises etching the copper foil using, for example, an etch chemistry comprising hydrogen peroxide ($H_2O_2$) and/or sulfuric acid ($H_2SO_4$). Other etching chemistries may include hypochlorite-based chemistries.

A step 460 of method 400 is to form an electrically conductive layer over the primer. As an example, the electrically conductive layer can be similar to electrically conductive layer 150 that is shown in FIG. 1 or to electrically conductive layer 250 that is shown in FIG. 2. In one embodiment, step 460 comprises a trench metallization process, possibly with steps as described above in connection with method 300, but alternatively with grinding or another metallization approach, that results in the formation of a copper trace.

Figure 6:
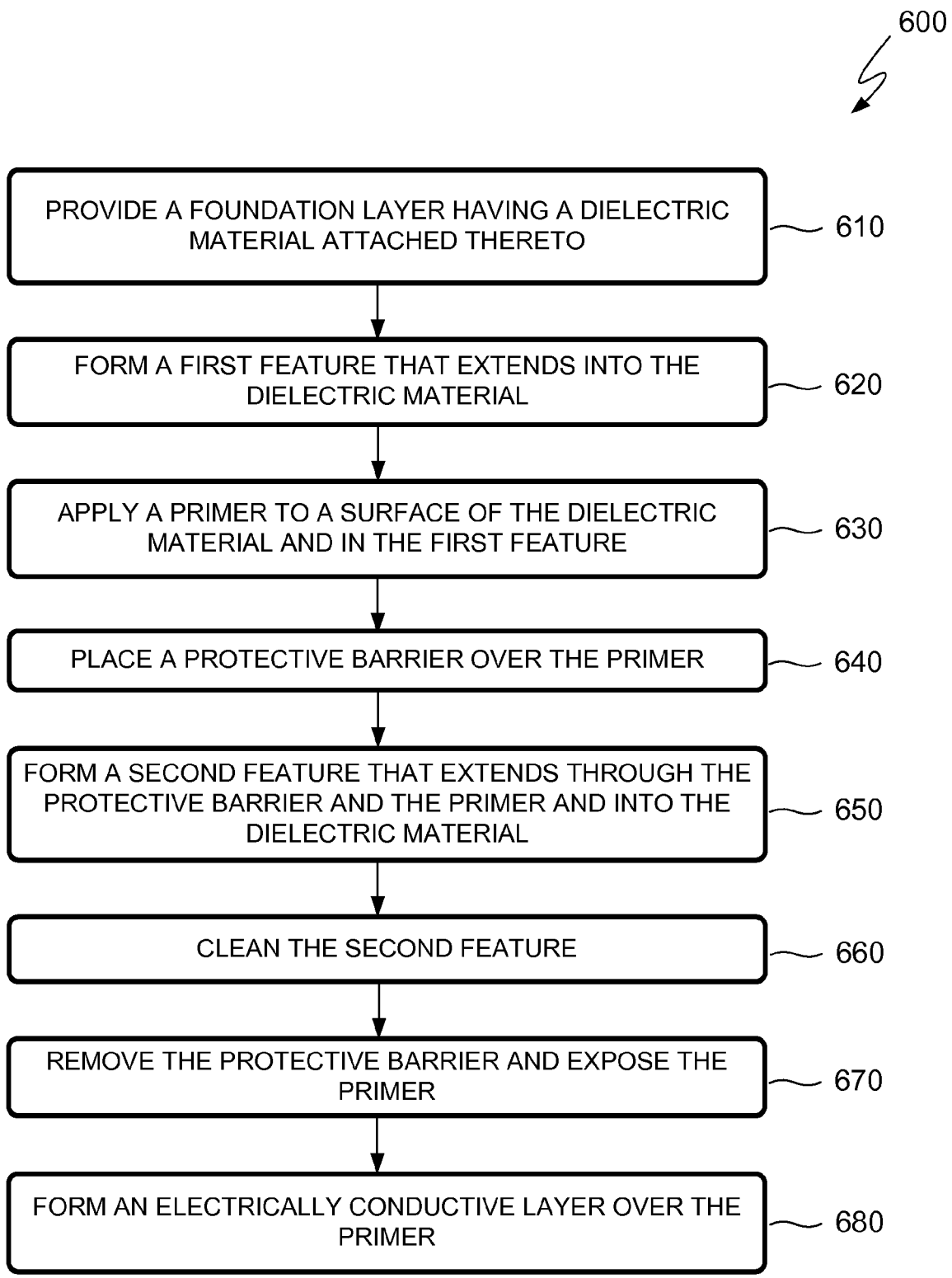

FIG. 6 is a flowchart illustrating a method 600 of manufacturing a substrate for a microelectronic device according to an embodiment of the invention. As an example, method 600 may be used as part of a laser ablation process or of some other technique that provides embedded features in a dielectric material, and may result in a structure that is the same as or similar to substrate 200 as depicted in FIG. 2.

A step 610 of method 600 is to provide a foundation layer having a dielectric material attached thereto. In general, dielectric lamination is done using incoming sheets of epoxy material which are partially cross-linked to fit the form of a sheet, after which they are laminated and pressed for partial curing onto the surface of the manufacturable package or substrate or the like. After the surface is drilled (for feature formation) and cleaned (e.g., with desmear) and electroless conductive material plating is done, a final cure step is performed to ensure the mechanical and thermal stability of the epoxy dielectric material. It should be understood that embodiments of the invention may utilize the foregoing dielectric lamination procedure in its entirety or only in part (or not at all), based on the needs of the application process for the final substrate or package being formed. As known in the art, such processes also change depending on the type of dielectric material used.

As an example, the foundation layer can be similar to material 110 that is shown in FIG. 1 or to material 210 that is shown in FIG. 2. As another example, the dielectric material can be similar to dielectric material 120 that is shown in FIG. 1 or to dielectric material 220 that is shown in FIG. 2. In one embodiment, step 610 comprises laminating the dielectric material onto the foundation layer.

A step 620 of method 600 is to form a first feature (or first group of features) that extends into the dielectric material. This first feature (or, if more than one, each feature in this first group) is a trench, such as feature 231 shown in FIG. 2. As an example, a laser, such as an excimer laser, a $CO_2$-based laser, a UV laser, or the like, may be used to perform step 620. Typically, an excimer laser would be used. Alternatively, other methods of trench feature formation may be utilized, including imprinting or the like.

A step 630 of method 600 is to apply a primer to a surface of the dielectric material and in the first feature (or features). As an example, the primer can be similar to primer 140 that is shown in FIG. 1 or to primer 240 that is shown in FIG. 2. In one embodiment, step 630 comprises coating the primer on the surface of the dielectric material using one of a thin film lamination process and a roller coating operation, though other coating techniques may also be used. As an example, in the latter approach step 630 may be accomplished using a roller coating apparatus such as that shown in FIG. 11, discussed below.

Figure 7:
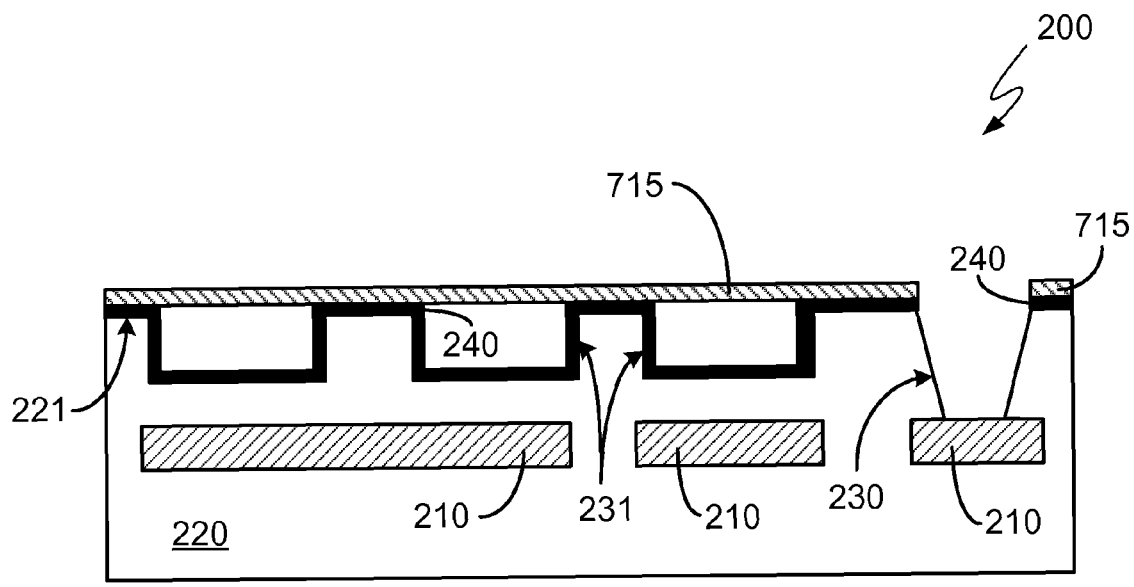
FIGS. 7 and 8 are cross-sectional views of the substrate of FIG. 2 at a particular point in its manufacturing process according to various embodiments of the invention.

A step 640 of method 600 is to place a protective barrier over the primer. As an example, the protective barrier can be similar to a protective barrier 715 that is shown in FIG. 7, which is a cross-sectional view of substrate 200 at a particular point in its manufacturing process according to an embodiment of the invention. In one embodiment, protective barrier 715 is a polyester film such as polyethylene terephthalate (PET) or the like. In a particular embodiment, the PET film is treated with teflon or the like on the top side before being laminated onto the primer. It should be noted that the thickness of the PET film must be sufficiently small that it does not affect $CO_2$ laser drilling, i.e., so the laser is able to achieve a sharp via profile. As an example, the PET film thickness may range from approximately 10-30 microns. However, other thicknesses, as appropriate, can be tailored based on laser power, laser intensity, desired feature size, and overall dielectric thickness.

Figure 8:
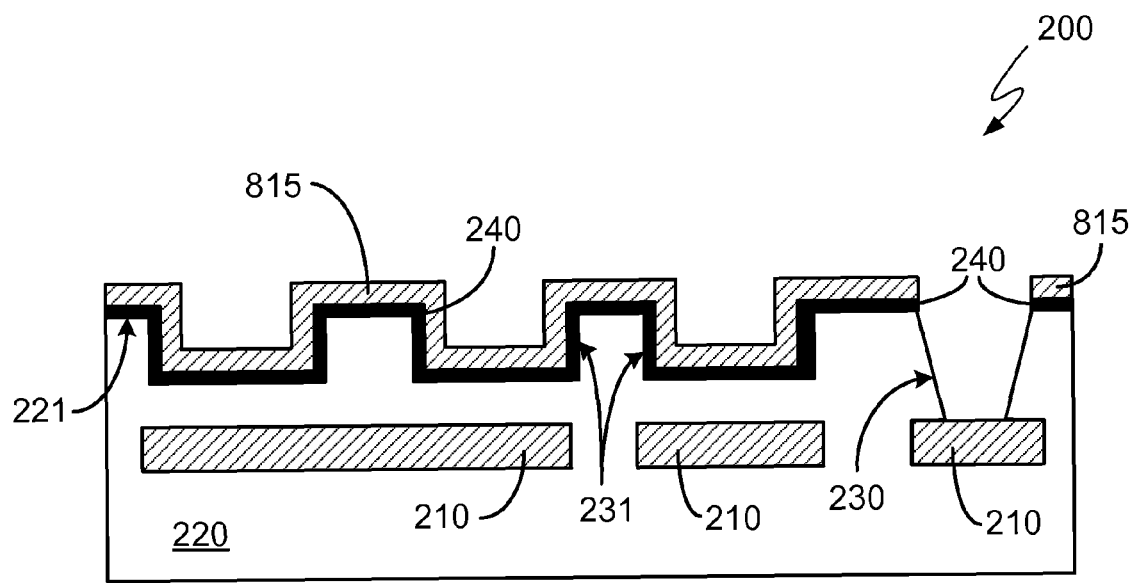

As another example, the protective barrier can be similar to a protective barrier 815 that is shown in FIG. 8, which is a cross-sectional view of substrate 200 at a particular point in its manufacturing process according to a different embodiment of the invention. In one embodiment, protective barrier 815 is an electrolessly-deposited copper or other metal layer, a copper or other metal layer put in place using some other deposition technique, or the like.

A step 650 of method 600 is to form a second feature (or second group of features) that extends through the protective barrier and the primer and into the dielectric material. This second feature (or, if more than one, each feature in this second group) is a via, such as feature 130 that is shown in FIG. 1 or feature 230 that is shown in FIG. 2. As an example, an excimer laser or a $CO_2$ laser may be used to perform step 650. Typically, a $CO_2$ laser would be used, but other feature formation techniques may also be used.

A step 660 of method 600 is to clean the second feature (or features). As an example, step 660 can comprise, at least in part, performing a desmear operation on a via. It should be noted that the desmear (or other) cleaning operation affects only the via (its bottom and sides) and not the trenches because the trenches are protected by the protective barrier. Among other things, this means that the protected portions of the substrate are not roughened or damaged. Note that in this case the desmear time, concentration, and aggressiveness need only be determined by via cleanliness requirements; because of the protection afforded by the protective barrier, the compromises in such desmear parameters required by existing processes that are designed to preserve trench integrity are not necessary.

A step 670 of method 600 is to remove the protective barrier and expose the primer. Step 670 includes exposing the primer that was applied in the first feature (or features). In an embodiment where the carrier sheet is a PET film, step 670 comprises peeling the PET film off of the primer. The use of the protective film enables the use of a wide variety of materials for laser ablation, many of which could not otherwise be used due to the impact of desmear on excimer laser-formed trenches. More specifically, in many instances the choice of dielectric material for laser ablation technology is limited by its desmear resistance to excimer treated surfaces. For instance, in many cases, dielectric material that can withstand desmear parameters for $CO_2$ laser-drilled vias fails to maintain the integrity of the trenches that are formed by excimer laser at a much lower wavelength. This precludes the use of certain materials, several of which may offer multiple advantages such as low CTE, good mechanical properties, and the like.

It should be noted that in an embodiment where the protective barrier is an electroless copper layer or the like, step 670 need not be performed at all. Instead, the copper (or other) protective barrier may be left in place and later merged with a subsequently-formed electrically conductive layer. In such an embodiment, the primer is not affected by subsequent cleaning operations because it is protected by the copper (or other) layer, and the copper (or other) layer itself is not adversely affected by the cleaning operation because the cleaning operation is designed to affect only organic materials, as discussed above.

A step 680 of method 600 is to form an electrically conductive layer over the primer. As an example, the electrically conductive layer can be similar to electrically conductive layer 150 that is shown in FIG. 1 or to electrically conductive layer 250 that is shown in FIG. 2. In one embodiment, step 680 comprises a trench metallization process, possibly with steps as described above in connection with method 300, but alternatively with grinding or another metallization approach, that results in the formation of a copper trace.

In one embodiment, method 600 further comprises partially curing the primer before placing the protective barrier (in order to hold the primer in place without impacting the final bond that subsequently needs to form between the primer and the dielectric), and fully curing the primer after forming the electrically conductive layer over the primer (in order to allow proper bonding of the primer to both interfaces). The curing process may be optimized in order to achieve proper adhesion integrity.

Figure 9:
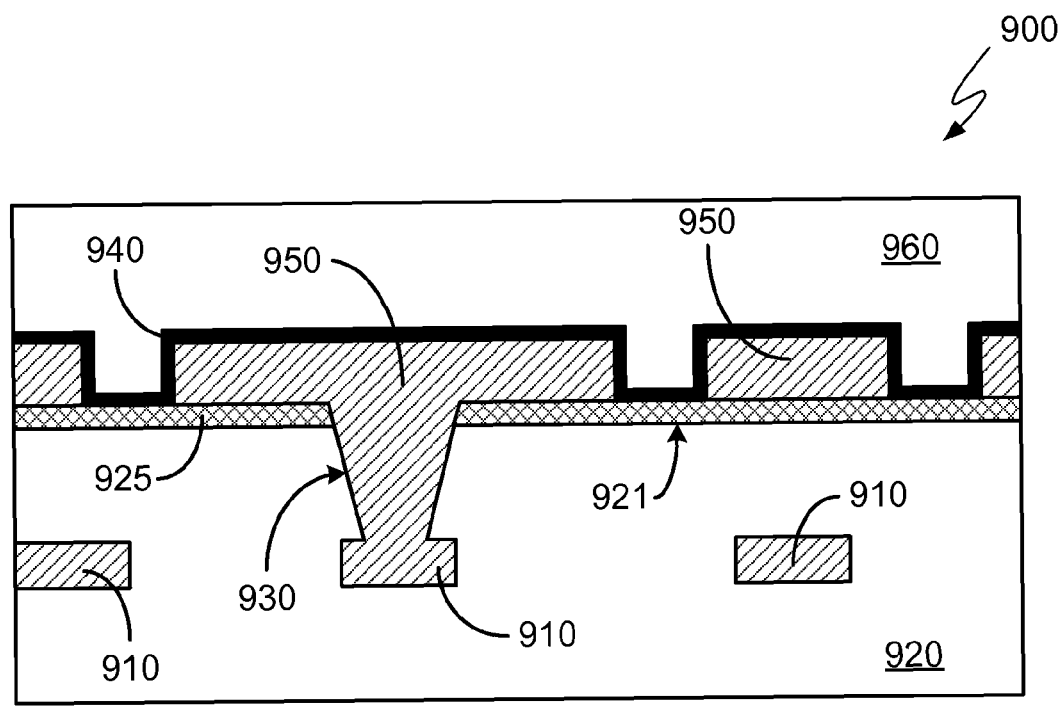

FIG. 9 is a cross-sectional view of a substrate 900 for a microelectronic device according to an embodiment of the invention. As an example, substrate 900 may be formed using an SAP process. As illustrated in FIG. 9, substrate 900 comprises a material 910 that is at least partially surrounded by a dielectric material 920, a feature 930 extending into dielectric material 920, a primer 940 over a surface 921 of dielectric material 920, an electrically conductive layer 950 adjacent to, i.e., under, primer 940, and a dielectric layer 960 over the primer. Note that electrically conductive layer 950 is located above surface 921 of dielectric material 920, characteristic of the SAP procedure.

FIG. 9 also depicts a primer 925 between surface 921 and electrically conductive layer 950. As an example, primer 925 may have been put in place at least in part to improve adhesion between dielectric material 920 and electrically conductive layer 950, just as primer 940 may have been put in place at least in part in order to improve adhesion between electrically conductive layer 950 and dielectric layer 960. If for any reason such improvement enhancement is not needed or desired at the interface between dielectric material 920 and electrically conductive layer 950, primer 925 would be omitted.

As an example, material 910, dielectric material 920, primer 925, feature 930, primer 940, and electrically conductive layer 950 can be similar to, respectively, material 110, dielectric material 120, primer 140, feature 130, primer 140, and electrically conductive layer 150, all of which are shown in FIG. 1. As another example, dielectric layer 960 can be similar to dielectric material 920.

Figure 10:
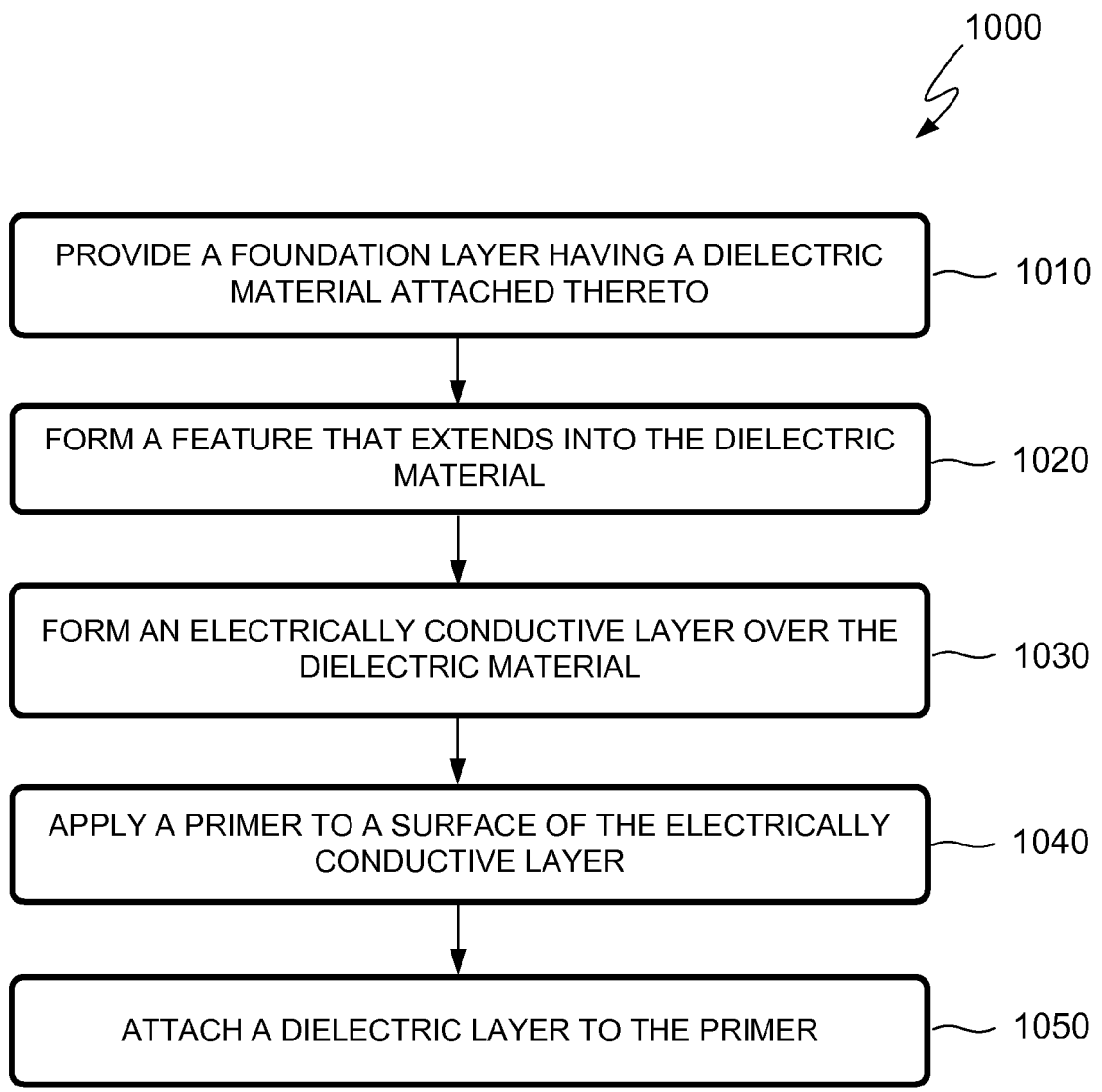

FIG. 10 is a flowchart illustrating a method 1000 of manufacturing a substrate for a microelectronic device according to an embodiment of the invention. As an example, method 1000 may be used as part of an SAP process, and may result in a structure that is the same as or similar to substrate 900 as depicted in FIG. 9.

A step 1010 of method 1000 is to provide a foundation layer having a dielectric material attached thereto. As an example, the foundation layer can be similar to material 110 that is shown in FIG. 1 or to material 210 that is shown in FIG. 2. As another example, the dielectric material can be similar to dielectric material 120 that is shown in FIG. 1 or to dielectric material 220 that is shown in FIG. 2. In one embodiment, step 1010 comprises laminating the dielectric material onto the foundation layer.

A step 1020 of method 1000 is to form a feature that extends into the dielectric material. As an example, the feature can be similar to feature 130 that is shown in FIG. 1 or to feature 230 or feature 231 that are shown in FIG. 2. Accordingly, in one embodiment the feature can be a via or a trench or the like. In the same or another embodiment, more than one feature may be formed, and what is said herein regarding the feature may also be applied to additional features of the same kind unless the text or the context indicate otherwise. As an example, an excimer laser or a $CO_2$ laser may be used to perform step 1020. In one embodiment, an excimer laser is used to form trenches and a $CO_2$ laser is used to form vias.

In the same or another embodiment, step 1020 or another step of method 1000 comprises cleaning the feature. As an example, the cleaning step can comprise, at least in part, performing a desmear operation on a via.

A step 1030 of method 1000 is to form an electrically conductive layer over the dielectric material. As an example, the electrically conductive layer can be similar to electrically conductive layer 150 that is shown in FIG. 1 or to electrically conductive layer 250 that is shown in FIG. 2.

A step 1040 of method 1000 is to apply a primer to a surface of the electrically conductive layer. As an example, the primer can be similar to primer 140 that is shown in FIG. 1 or to primer 240 that is shown in FIG. 2. In one embodiment, step 1040 comprises coating the primer on the surface of the dielectric material using one of a thin film lamination process and a roller coating operation, though other coating techniques may also be used. As an example, in the latter approach step 1040 may be accomplished using a roller coating apparatus such as that shown in FIG. 11, discussed below.

A step 1050 of method 1000 is to attach a dielectric layer to the primer. As an example, the dielectric material in this layer can be similar to that in dielectric layer 960 that is shown in FIG. 9.

In one embodiment, method 1000 further comprises partially curing the primer after it is applied and before attaching the dielectric layer (in order to hold the primer in place without impacting the final bond that subsequently needs to form between the primer and the dielectric), and fully curing the primer after attaching the dielectric layer over the primer (in order to allow proper bonding of the primer to both interfaces). The curing process may be optimized in order to achieve proper adhesion integrity.

Note that a manufactureable package may have one or both interface types (conductive material to dielectric or dielectric to conductive material) coated with primer material, as described herein, on either a single layer or on plural layers in a package or substrate. The presence of primer on one such interface does not dictate whether its presence is required at any other such interface. Such applications and processes may also be applied directly to motherboard manufacturing or to boards where direct chip attach is done.

Figure 11:
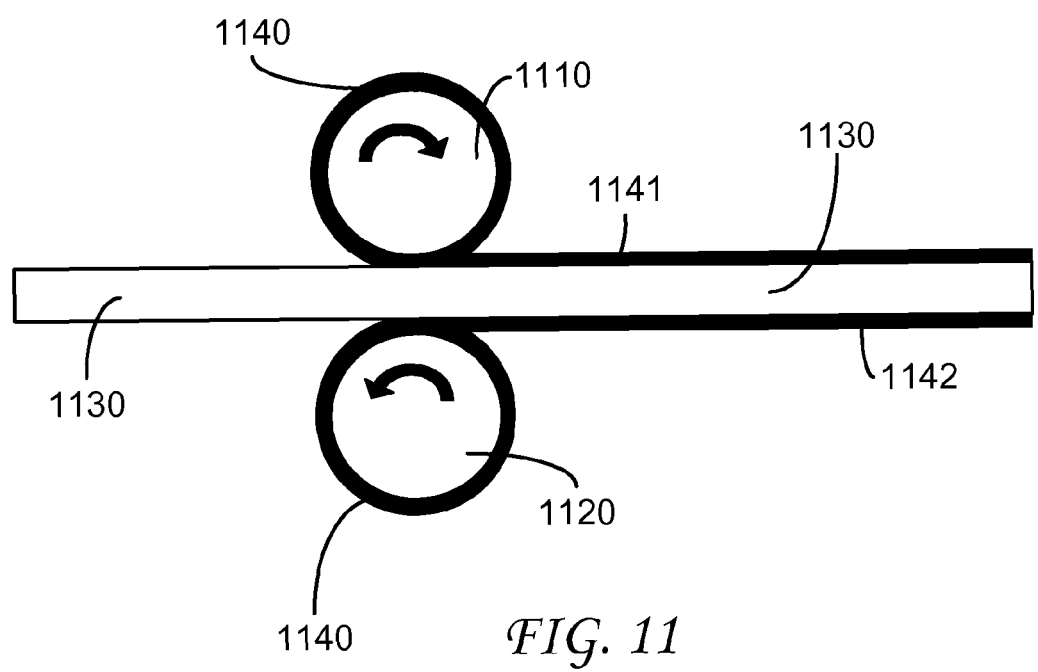
FIG. 11 is a representation of a roller coating apparatus that may be used in connection with an embodiment of the invention.

FIG. 11 is a representation of a roller coating apparatus 1100 that may be used in connection with an embodiment of the invention. As illustrated in FIG. 11, roller coating apparatus 1100 comprises rollers 1110 and 1120. When a workpiece 1130 is introduced into roller coating apparatus 1100, a primer 1140 is introduced in liquid form onto rollers 1110 and 1120 and formed into a layer 1141 of primer on an upper surface of workpiece 1130 and a layer 1142 of primer on a lower surface of workpiece 1130, as shown. As an example, workpiece 1130 can be (or can be similar to) one or more of substrates 100, 200, or 900 (or portions thereof). In one embodiment, only one layer of primer, e.g., layer 1141, may be applied and the other layer omitted. In any case, roller coating apparatus 1100 provides a uniform coating of primer on top of the copper traces (and elsewhere, as required).

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the substrates and related manufacturing methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a substrate for a microelectronic device, the method comprising:
 providing a dielectric material as a build-up layer of the substrate;
 applying a primer to a surface of the dielectric material; and
 forming an electrically conductive layer over the primer, wherein:
  applying the primer to the surface of the dielectric material comprises first applying the primer to a carrier sheet and then applying the carrier sheet with the primer to the surface of the dielectric material;
  forming the electrically conductive layer over the primer occurs after the carrier sheet is removed to expose the primer; and
  after applying the primer the method further comprises:
   forming a feature that extends through the carrier sheet and the primer and into the dielectric material;
   cleaning the feature; and
   removing the carrier sheet and exposing the primer.

2. The method of claim 1 wherein:
the carrier sheet is a copper foil.

3. The method of claim 1 wherein:
the feature comprises a via; and
cleaning the feature comprises performing a desmear operation on the via.

4. The method of claim 1 wherein:
removing the carrier sheet comprises etching the copper foil.

5. A method of manufacturing a substrate for a microelectronic device, the method comprising:
 providing a dielectric material as a build-up layer of the substrate;
 applying a primer to a surface of the dielectric material; and
 forming an electrically conductive layer over the primer, wherein:
  prior to applying the primer, the method further comprises forming a first feature that extends into the dielectric material;
  applying the primer further comprises applying the primer in the first feature;
  after applying the primer the method further comprises:
   placing a protective barrier over the primer;
   forming a second feature that extends through the protective barrier and the primer and into the dielectric material;
   cleaning the second feature; and
   removing the protective barrier and exposing the primer; and
  forming the electrically conductive layer over the primer occurs after the protective barrier is removed to expose the primer.

6. The method of claim 5 wherein:
the protective barrier is a polyester film.

7. The method of claim 5 wherein:
the protective barrier is a layer of copper.

8. The method of claim 5 wherein:
the first feature comprises a trench and the second feature comprises a via; and
cleaning the second feature comprises performing a desmear operation on the via.

9. The method of claim 5 wherein:
applying the primer comprises coating the primer on the surface of the dielectric material using one of a thin film lamination process and a roller coating operation.

10. The method of claim 5 further comprising:
partially curing the primer before placing the protective barrier; and
fully curing the primer after forming the electrically conductive layer over the primer.

11. The method of claim 1 wherein:
forming the electrically conductive layer comprises:
 electrolessly depositing a first copper layer;
 patterning the first copper layer using a film resist;
 electrolytically depositing a second copper layer over the first copper layer; and
 removing the film resist.

* * * * *